United States Patent [19]

Hamzehdoost et al.

[11] Patent Number: 5,491,362
[45] Date of Patent: Feb. 13, 1996

[54] PACKAGE STRUCTURE HAVING ACCESSIBLE CHIP

[75] Inventors: Ahmad Hamzehdoost, Sacramento; Leonard L. Mora, San Jose, both of Calif.

[73] Assignee: VLSI Technology, Inc., San Jose, Calif.

[21] Appl. No.: 106,146

[22] Filed: Aug. 13, 1993

Related U.S. Application Data

[63] Continuation of Ser. No. 876,249, Apr. 30, 1992.

[51] Int. Cl.$^6$ .......................... H01L 23/48; H01L 23/02; H01L 25/04; H01L 29/44
[52] U.S. Cl. .......................... 257/712; 257/675; 257/676; 257/680; 257/684; 257/687; 257/713; 257/714
[58] Field of Search .................... 257/675, 676, 257/680, 684, 687, 712, 713, 714

[56] References Cited

U.S. PATENT DOCUMENTS

| | | | |
|---|---|---|---|
| 3,521,128 | 7/1970 | Oates | 257/376 |
| 4,809,053 | 2/1989 | Kuraishi | 357/70 |
| 4,876,588 | 10/1989 | Miyamoto | 357/81 |
| 4,976,588 | 10/1989 | Miyamoto | 257/713 |
| 4,996,587 | 2/1991 | Hinrichsmeyer et al. | 257/676 |

Primary Examiner—Jerome Jackson
Assistant Examiner—Valencia Martin Wallace
Attorney, Agent, or Firm—Patrick T. King

[57] ABSTRACT

A package for an integrated-circuit includes a package body having a die-cavity formed therein. A die-attach pad is formed in the package body adjacent the die-cavity. An opening is formed in the central portion of the die-attach pad for exposing one side of the integrated-circuit die so that an external cooling media can directly contact the exposed side of the integrated-circuit die. The die-attach pad can be formed as a die-mounting ring adjacent the die-attach cavity. The peripheral edge of the integrated-circuit die is fixed to a mounting surface on the die-mounting ring portion to accommodate direct cooling of the exposed side of the integrated-circuit die. The mounting surface of the die-mounting ring extends beyond the peripheral edge of the integrated-circuit die to accommodate a range of sizes of the integrated-circuit die. The exposed surface of the integrated circuit die is cooled, for example, with a cooling fluid, a heatsink, or a thermo-electric refrigeration unit in contact with the exposed side of the die. The exposed side of the die is coated with a film to provide a seal for the exposed side of the integrated-circuit die.

15 Claims, 3 Drawing Sheets

PACKAGE STRUCTURE HAVING ACCESSIBLE CHIP

This is a continuation of copending application Ser. No. 07/876,249 filed on Apr. 30, 1992.

BACKGROUND OF THE INVENTION

1. Field of the Invention

This invention relates to packaging for integrated-circuit chips and, more particularly, to packaging techniques which provide improved cooling for an integrated-circuit chip.

2. Prior Art

Efficient removal of heat from a packaged integrated-circuit chip is very important because the temperature of the integrated-circuit chip must be kept below certain designated temperatures to avoid degraded performance or to prevent damage to the chip. Very often, a silicon integrated-circuit chip is enclosed in a package, where the package itself has a significant thermal resistance. Heat energy travels in series from its source in the integrated-circuit through the thermal resistance of the package to the ambient. For a given amount of heat power being generated by the integrated-circuit chip, higher values of thermal resistance produce higher temperatures in the integrated-circuit chip. The overall thermal resistance for the series combination of the chip and the package is always greater than the thermal resistance of the package alone so that the thermal resistance of the package often limits the thermal performance of the integrated-circuit chip.

Two commonly used packages for integrated-circuit chips are a pin-grid-array (PGA) package and a plastic quad flat pack (PQFP) package configurations. The PGA package is square and has a number of downwardly extending, uniformly-spaced terminal pins arranged on a grid. A PQFP package has bent, flat leads extending from all four sides of the package. Both types of package structures enclose a silicon chip and have thermal resistance, preventing direct removal of heat from the integrated-circuit chip. No matter how well the ambient removes heat from the package, the package still remains as an insulator. It is not possible to achieve a thermal resistance lower than the thermal resistance of the package.

FIG. 1 shows a standard pin-grid-array PGA package assembly 10. The assembly includes a package body 12 formed of a ceramic or molded plastic material. A recessed cavity 14 is formed in a front side of the package body 12 for receiving an integrated circuit die, or chip, 16. The integrated-circuit die 16 is fixed with a layer 18 of die-attach material to the interior surface of a rear wall 20 of the package body 14, where the rear wall 20 defines the interior boundary of the cavity 14. Wire-bonding pads on the surface of the integrated-circuit die 16 are connected by bonding wires (typically shown as 22, 24) to corresponding bonding-pad portions of internal conductors (typically shown as 28) contained within the package body 14. The internal conductors 28 are connected with conventional feed-through solder connection means to respective connection pins (typically shown as 30, 32). A problem with this conventional PGA package configuration is that heat from the integrated-circuit die 18 must travel through the thickness of the wall 20 and other parts of the body of the package to escape to the ambient. Consequently, the thermal performance of the package is limited by the thermal coefficient of the wall material and the thickness of the wall 20.

A number of prior solutions are available for lowering the thermal resistance of a standard PGA package configuration for an integrated-circuit chip. One solution is to use a package material which has a better thermal conductivity. For example, a ceramic material can be used instead of a plastic material for the packaging material.

FIG. 2 shows another technique for improving the thermal performance of a pin-grid-array PGA package assembly 50. The pin-grid-array PGA package assembly 50 is similar to the package assembly of FIG. 1 and the same reference numerals are used for like elements. The pin-grid-array PGA package assembly 50 uses an additional component within a package body 52 for the package assembly 50. That component is an internal heat spreader 54, which is a plate, or slug, formed of copper or copper/tungsten material. The integrated-circuit chip 16 is bonded to the heat spreader 54 with a layer 56 of suitable die-attach material, as indicated in the figure.

Use of the heat spreader 54 improves the heat transfer characteristics of the package 50, but the heat spreader 54 is still in the series thermal path from the ambient to the integrated-circuit chip 16. A significant problem with using a heat spreader 54 is that cracks develop in the body of the package 52 near the junction of the heat spreader 54 and the package 52. As the metal of the heat spreader 54 expands and contracts with changes in temperature, the stronger, more rigid metal heat spreader exerts stress on the package body 52 and also on the integrated-circuit die 16, causing the package material to crack. To reduce the amount of stress on the package body, the heat spreader 54 is kept small, that is, approximately the same size as the area of the integrated-circuit die 16.

FIG. 3 shows another type of conventional package assembly for integrated-circuits. A standard plastic quad flat-pack package PQFP 100 includes a package body 102 formed of molded plastic material. The molded-plastic body 102 is molded around an integrated-circuit die 104, which is fixed to a die-attach pad 106 portion of a standard leadframe, using a suitable layer of die-attach material 108, as indicated in the figure. Wire-bonding pads on the surface of the integrated-circuit die 104 are connected by bonding wires (typically shown as 110, 112) to corresponding bonding finger portions of leads (typically shown as 114, 116), which extend out of the package body 102, as indicated in the figure.

Similar to the case of the standard PGA package, a problem with the conventional PQFP package configuration is that heat from the integrated-circuit die 104 must travel through the body 102 of the package and through the thickness of the walls of the package body to escape to the ambient. Depending on the thermal coefficient of the wall material and the thickness of the wall, the thermal performance of the package is limited by the thermal resistance of the plastic package-molding material.

FIG. 4 shows a technique for improving the thermal performance of a plastic quad flat pack PQFP package assembly 150, which is similar to the package assembly of FIG. 3 and where the same reference numerals are used for like elements. A PQFP package body 152 uses an internal heat spreader 154, which is a plate, or slug, formed of copper or copper/tungsten material. The outside surface of the die-attach pad 106 is bonded to the heat spreader 154, as indicated in the figure. Use of the heat spreader 154 improves the heat transfer characteristics of the PQFP package assembly 150.

As in the case of the PGA package, the heat spreader 154 for the PQFP package is still in the series thermal path from the ambient to the integrated-circuit chip 104. Cracks also develop in the body of the package 152 near the junction of the heat spreader 154 and the package 152. As the metal of the heat spreader 154 expands and contracts with changes in temperature, the stronger, more rigid metal heat spreader 154 exerts stress on the package body 152 and on the integrated-circuit die 104, causing the package material to crack. To reduce the amount of stress on the package body, the heat spreader 154 is kept small, approximately the same size as the area of the integrated-circuit die 104.

SUMMARY OF THE INVENTION

It is therefore an object of the invention to provide a reliable, economical technique for providing direct access to the back of an integrated-circuit chip packaged in a pin grid array PGA package or a plastic quad flat pack PQFP package so that various types of direct-cooling mechanisms can be applied directly to the back of the chip.

In accordance with this and other objects of the invention, the peripheral edge of a silicon chip is die-attached to a die-attach pad, formed as a ring within the package. The center of the ring, or pad, is open to provide direct access to the exposed back side of a silicon chip for a cooling media. The back side of the silicon chip can be metallized for sealing purposes. Various types of cooling media can be applied directly to the exposed back of the chip, including cooling-fluid flows, an external heatsink, and refrigeration units, using, for example, a cooling fluid or a thermoelectric pump.

In one preferred embodiment of the invention, the integrated-circuit package body has a die-cavity formed therein. A die-attach pad has a die-attach surface portion formed adjacent the die-cavity in the package body. The die attach pad has an opening formed in the central portion thereof for exposing one side of the integrated-circuit so that an external cooling media can directly contact the one side of the integrated-circuit die. The exposed side of the die is coated with a film to provide a seal for the exposed side of the integrated-circuit die.

In another preferred embodiment of the invention the package body has a ring portion formed therein adjacent the peripheral edge of the die cavity and extending from the package body into the die cavity. The peripheral edge of the integrated-circuit die is fixed up to a mounting surface of the ring portion of said package body to provide exposure of the one exposed side of said integrated-circuit die to accommodate direct cooling of the exposed side of the integrated-circuit die. The mounting surface of the ring portion of the integrated-circuit package extends outwardly beyond the peripheral edge of the integrated-circuit die to accommodate a range of sizes of the integrated-circuit die. Various means for fluid cooling the exposed side of the integrated-circuit die are provided, including an external heatsink, fluid coolants (such as air or water), and mechanical refrigeration units (such as thermo-electric refrigeration units) in contact with the exposed side of the die.

The invention provides a method of directly cooling an integrated-circuit die in a package. The method includes fixing the peripheral surface of one side of an integrated-circuit die to a mounting surface formed on an inwardly extending portion of a package body, which has a cavity formed therein for accepting the integrated circuit die. One side of the integrated-circuit die is exposed to the ambient through an opening formed in the package body. The method of claim 7 includes the step of contacting the one exposed side of the integrated-circuit die with a cooling means which can be a fluid cooling media, an external heatsink, or a thermo-electric cooling device.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 5:
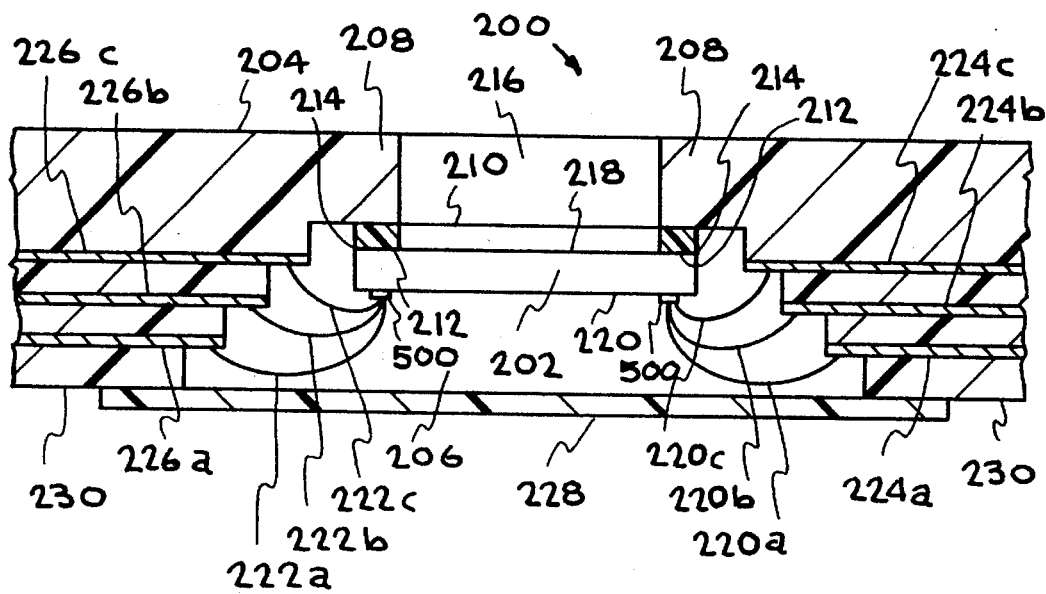
FIG. 5 is sectional view of a PGA packaging configuration according to the invention, which has a die accessible from the back side of the package.

FIG. 5 shows an embodiment of a pin-grid-array PGA packaging configuration 200 according to the invention. In this configuration, an integrated-circuit die 202 is directly accessible for cooling from the back surface, or side, of the body 204 of the package. A cavity 206 is formed into one face of the package body 204 for receiving the integrated-circuit die 202, as indicated in the figure. Extending outwardly from the body 204 is a shoulder, or ring portion 208. The ring 208 has a die-mounting surface 210 on one side. To this one side is fixed the corresponding peripheral edge surface 212 of the integrated-circuit die 202, using a suitable die-attach material 214, such as silver-filled epoxy, silver glass, or gold silicon eutectic. The cavity 206 is extended through the body 204 of the package 200 to provide an opening 216 adjacent the back surface, or back side, 218 of the integrated-circuit die 202, as indicated in the figure. The opening 216 provides for direct access to the back side 218 of the integrated-circuit die 202. The back side of the die can be covered with a film of sealing material, such as gold or aluminum to seal the die from the ambient. As described hereinbelow, various means for directly cooling the back side 218 of the integrated-circuit die 202 are available.

The front surface, or side, 220 of the integrated-circuit die 202 has various layers of materials formed and deposited thereupon to form the structure of the various devices of the integrated circuit. A number of bonding wires (typically shown as 222a, 222b, 222c and 220a, 220b, 220c) each have one end connected to various wire-bonding pads on the front side 220 of the integrated-circuit die 202. The other ends of the various bonding wires 222a, 222b, 222c and 220a, 220b, 220c are connected to respective bonding fingers of various internal, multilayer conductors (typically shown as 224a, 224b, 224c, and 226a, 226b, 226c). As shown in the figure, the bonding fingers and associated conductors are provided at various levels within the body of the package. The internal conductors 226a, 226b, 226c and 224a, 224b, 224c are connected with feed-through solder connections to respective PGA connector pins (not shown) which provide external connections to the integrated-circuit package. A lid 228 has its edges fixed to the front surface 230 of the package body 204 to seal the integrated-circuit die 202 within the die-attach cavity 206.

Figure 6:
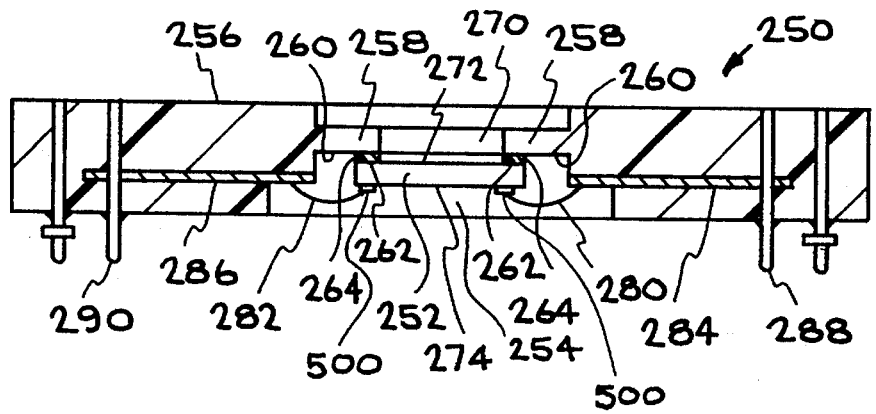
FIG. 6 is a sectional of an alternative embodiment of PGA package configuration according to the invention, which can accommodate various sizes of integrated-circuit dies, where the dies are directly accessible from their back sides for cooling.

FIG. 6 illustrates an embodiment of a PGA package configuration 250 according to the invention. This configuration is designed to accommodate integrated-circuit dies of various sizes, while still permitting the back side of a die to be accessed directly from its back side for cooling purposes. In this embodiment, a typical integrated-circuit die 252 is contained in a cavity 254 formed into the front face of a package body 256, as indicated in the figure. A die-mounting ring 258 extends inwardly from the package body 256 into the cavity 254. The ring 258 has a die-mounting surface 260 formed on its front side. The corresponding peripheral edge surface 262 of the integrated-circuit die 252 is fixed to the die-mounting surface 260, using a suitable die-attach material 264. An opening 270 is provided through the ring 258 and is located adjacent the back surface, or side 272 of the integrated-circuit die 252. The opening 270 provides for direct access to the back side 272 of the integrated circuit die 252 for directly cooling the back side 272 of the integrated-circuit die 252.

The PGA package configuration 250 of FIG. 6 provides a single PGA package body for mounting various sizes of integrated-circuit dies to the mounting ring 258, while still permitting direct access to the back side of a die.

Various layers of materials are formed and deposited on the front surface, or side 274 to form the various structures of the integrated-circuit die 252. To seal the exposed rear side 272 of the integrated-circuit die 252, a film of a suitable material, such as gold or aluminum, is formed on the rear side 272 of the integrated-circuit die 252.

Bonding wires (typically shown as 280, 282) each have one end connected to a wire-bonding pad 500 on the front side 274 of the integrated-circuit die 252. The other ends of the bonding wires are connected to respective bonding fingers of the internal conductors (typically shown as 284, 286), which are connected with feed-through solder connections to respective pins 288, 290 to provide external connections to the integrated-circuit package. A suitable lid (not shown) seals the integrated-circuit die 252 within the die-attach cavity 254 in the package body 256.

Figure 7:
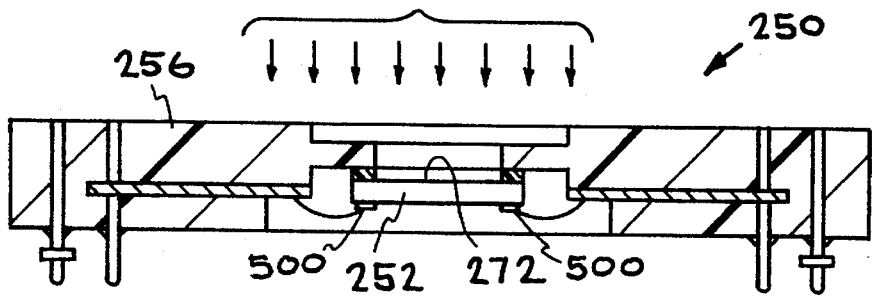
FIG. 7 is a sectional view of a PGA package configuration according to the invention which is cooled by a flow of cooling fluid, such as air, onto the exposed back side of an integrated-circuit die.

FIG. 7 illustrates one of the various means for directly cooling the exposed back side 272 of the integrated-circuit die 252 contained in the PGA package configuration 250 illustrated in FIG. 6, according to the invention. In this case, the arrows indicate a flow of cooling fluid, such as air or water, onto the exposed back side 272 of the integrated-circuit die 252. The cooling fluid passes through the opening 270 of FIG. 6 to directly contact the exposed back side 272 of the integrated-circuit die 252.

Figure 8:
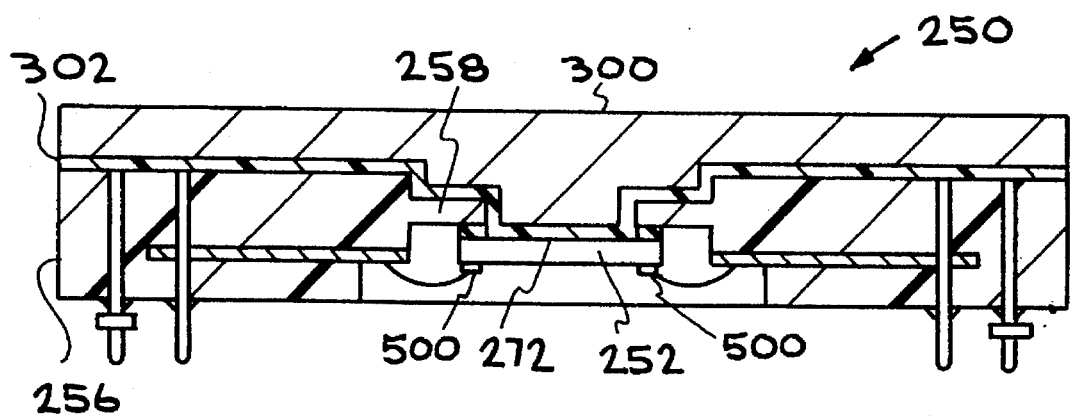
FIG. 8 is a sectional view of a PGA package configuration according to the invention which is cooled, for example, by a thermoelectric refrigeration unit.

FIG. 8 illustrates another of the various means for directly cooling the exposed back side 272 of the integrated-circuit die 252 contained in the PGA package configuration 250 illustrated in FIG. 6. A thermoelectric refrigeration unit, or a conventional heatsink, generally represented by reference number 300, is fixed, for example, to the package body 256 using a layer of heat-conductive, adhesive material 302. The thermoelectric refrigeration unit 300 or conventional heatsink may be shaped as indicated in the figure to have portions which conform to: the exposed back side 272 of the integrated-circuit die 252; the back side of the ring 258; and the outer surface of the package body 256.

Figure 9:
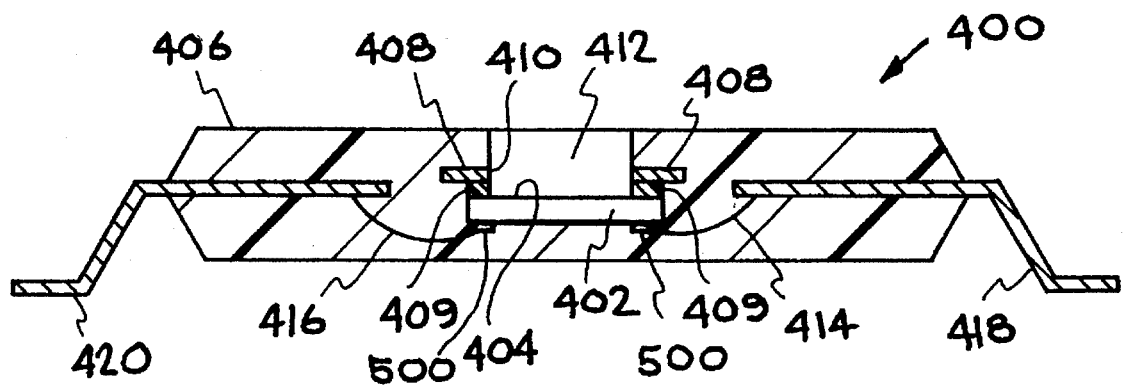
FIG. 9 is a sectional view of a plastic quad flat pack PQFP package configuration, which has an integrated-circuit die accessible from its exposed back side.

FIG. 9 illustrates a plastic quad flat pack package PQFP assembly 400 having an integrated-circuit die 402 which can be accessed from its exposed back side 404. The package assembly 400 includes a package body 406 formed of molded plastic material and molded around the integrated-circuit die 402. The integrated-circuit die 402 is fixed to a die-attach pad 408 with a suitable layer 409 of die-attach material, as indicated in the figure.

Figure 1:
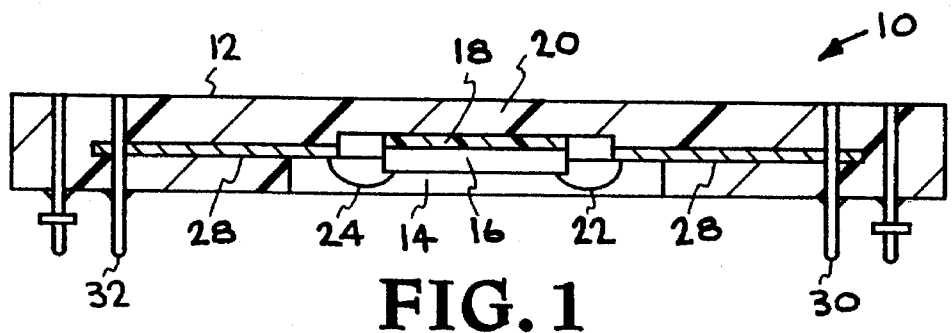
FIG. 1 is a sectional view of a conventional, standard pin-grid-array PGA package configuration.
Figure 2:
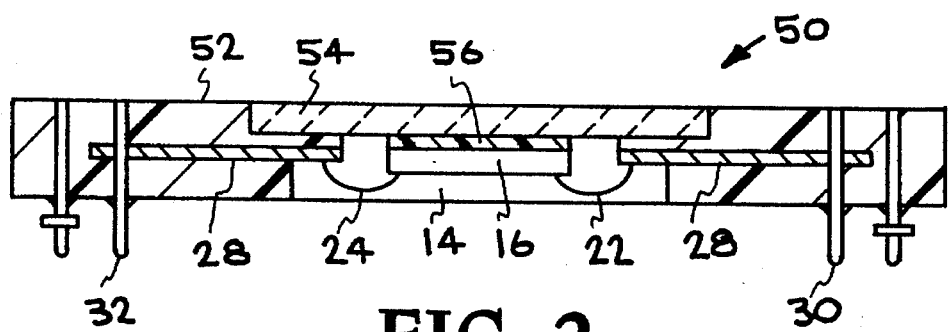
FIG. 2 is a sectional view of a conventional pin-grid-array PGA package configuration with an internal heat spreader contained within the package.
Figure 3:
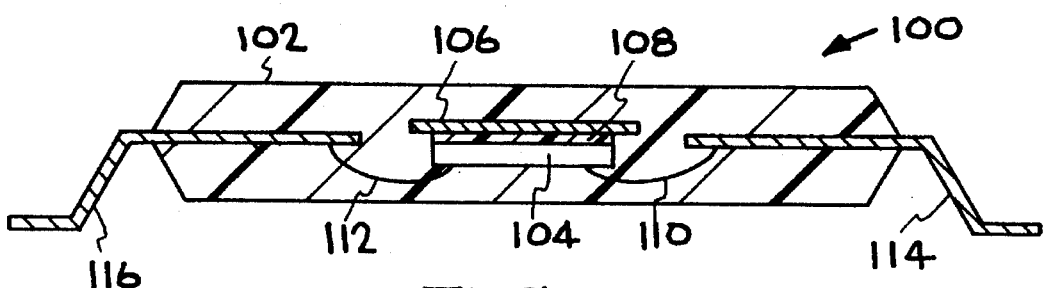
FIG. 3 is a sectional view of a conventional, standard plastic quad flat-pack PQFP package configuration.
Figure 4:
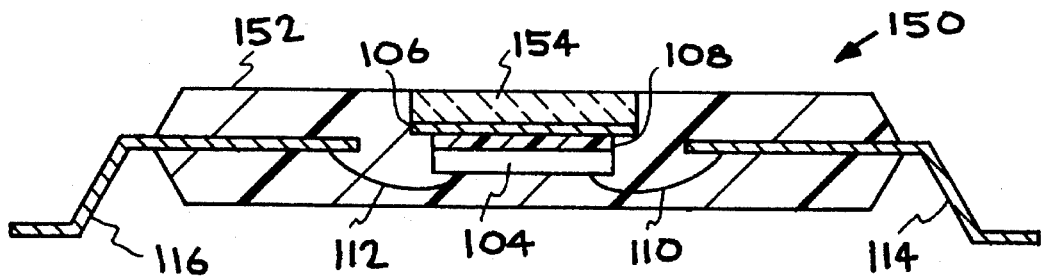
FIG. 4 is a sectional view of a conventional plastic quad flat-pack PQFP package configuration, also with an internal heat spreader contained within the package.

The die-attach pad 408 has a central opening 410 formed therein. This is a modification from the conventional die-attach pad 106, such as shown in FIG. 3 of the drawings. The die-attach pad 408 is formed of a number of different materials including: copper or copper alloy; ceramic; alumina nitride; silicon carbide; and glass epoxy. The package body 406 is molded to have an opening 412 through the body 406 to expose the back side 404 of the integrated-circuit die 402 for direct cooling, as indicated in the figure. Various means for directly cooling the back side 404 of the integrated-circuit die 402 are available, as described, for example, with reference to FIGS. 7 and 8 hereinabove.

Wire-bonding pads 500 on the top surface of the integrated-circuit die 402 are connected by bonding wires (typically shown as 414, 416) to corresponding bonding finger portions of leads (typically shown as 418, 420. The leads are embedded in the molded plastic body 406 and extend out the sides of the package body, as indicated in the figure.

The various embodiments of the package configuration according to the invention can be arranged either with the die-cavity located on the top of the package—that is, cavity-up, or with the die-cavity located on the bottom of the package—that is, cavity-down, as required.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. An integrated-circuit package assembly for an integrated-circuit die, comprising:

said integrated-circuit die having a first, front surface on which are formed wire-bonding pads, said integrated-circuit die having a second, back surface, wherein said second, back surface has a mounting area adjacent to a peripheral edge of said integrated-circuit die for mounting said integrated-circuit die;

a package body having a die cavity formed therein for receiving said integrated-circuit die, said package body having a ring portion formed therein adjacent to the die cavity, wherein said ring portion extends from said package body into the die cavity, wherein said ring portion includes a mounting surface to which the mounting area on said second, back surface, of said integrated-circuit die is fixed to provide exposure of the back side of said integrated-circuit die and to accommodate direct cooling of the exposed back side of the integrated-circuit die; and bonding wires connected between the wire-bonding pads on the front surface of the integrated circuit die and lead fingers of a leadframe for the integrated-circuit package assembly.

2. The integrated-circuit package assembly of claim 1 wherein the mounting surface of the ring portion of the integrated-circuit package extends inwardly beyond the peripheral edge of the integrated-circuit die to accommodate a range of sizes of the integrated-circuit die.

3. The assembly of claim 1 including a refrigeration unit in contact with the exposed back side of the die.

4. The assembly of claim 1, including heatsink means, contacting the exposed back side of the integrated circuit, for cooling said integrated-circuit die.

5. The assembly of claim 1 wherein the exposed side of the die is coated with a film of protective sealing material to provide a seal to protect said exposed back side of the integrated-circuit die from the ambient.

6. The assembly of claim 1 wherein the wire-bonding pads on the first, front surface of the integrated-circuit die are located adjacent to the peripheral edge of said integrated-circuit die.

7. A package structure having an accessible chip comprising:

an integrated-circuit die having front and back surfaces, said front surface having wire-bonding pads peripherally disposed thereon, said back surface having a mounting area peripherally located thereon, a package body having a die cavity formed therein for receiving said integrated-circuit die, said package body having a ring portion formed therein adjacent to said die cavity, wherein said ring portion extends from said package body into said die cavity, said ring portion including a mounting surface to which said mounting area on said back surface of said integrated-circuit die is fixed such that said integrated-circuit die is secured within said die cavity in a die-down configuration with said back surface of said integrated-circuit die exposed thereby allowing direct cooling of said exposed back surface of said integrated-circuit die; and bonding wires connected between said wire-bonding pads peripherally located on said front surface of said integrated circuit die and lead fingers of a leadframe for said integrated-circuit package assembly, 8. The package structure of claim 7 wherein said exposed back surface of said integrated-circuit die is coated with a film of protective sealing material to provide a protective carrier over said exposed back surface of said integrated-circuit die.

9. The package structure of claim 7 wherein said ring portion of said package body extends from said package inwardly into said die cavity such that said mounting surface is able to accommodate mounting thereon of a plurality of sizes of mounting areas corresponding to differing sized integrated-circuit dies, thereby allowing a single package body to accommodate various sizes of integrated-circuit dies.

10. The package structure of claim 7 wherein a refrigeration unit is disposed in contact with said exposed back surface of said integrated-circuit die, thereby providing cooling to said die.

11. The package structure of claim 7 wherein heatsink means is disposed in contact with said exposed back surface of said integrated-circuit die, thereby providing cooling to said die.

12. The package structure of claim 7 wherein ambient air is in contact with said exposed back surface of said integrated-circuit die, thereby providing cooling to said die.

13. An integrated-circuit package structure for housing and exposing an integrated-circuit die comprising:

an integrated-circuit die having front and back surfaces, said front surface having wire-bonding pads peripherally disposed thereon, said back surface having a mounting area peripherally located thereon, a package body having a die cavity formed therein for receiving said integrated-circuit die, said package body having a ring portion formed therein adjacent to said die cavity, wherein said ring portion extends from said package body into said die cavity, said ring portion including an integrated-circuit die mounting surface to which said mounting area on said back surface of said integrated-circuit die is fixed such that said integrated-circuit die is secured within said die cavity in a die-down configuration with said back surface of said integrated-circuit die exposed thereby allowing direct cooling of said exposed back surface of said integrated-circuit die, ambient air contacting said exposed back surface of said integrated-circuit die, thereby providing cooling to said die; and bonding wires connected between said wire-bonding pads peripherally located on said front surface of said integrated circuit die and lead fingers of a leadframe for said integrated-circuit package assembly.

14. The package structure of claim 13 wherein said exposed back surface of said integrated-circuit die is coated with a film of protective sealing material to provide a protective barrier over said exposed back surface of said integrated-circuit die.

15. The package structure of claim 13 wherein said ring portion of said package body extends from said package inwardly into said die cavity such that said mounting surface is able to accommodate mounting thereon of a plurality of sizes of mounting areas corresponding to differing sized integrated-circuit dies, thereby allowing a single package body to accommodate various sizes of integrated-circuit dies.

* * * * *